(12) United States Patent
Sato

(10) Patent No.: US 7,405,435 B2
(45) Date of Patent: Jul. 29, 2008

(54) SEMICONDUCTOR DEVICE HAVING ELECTROSTATIC DESTRUCTION PROTECTION CIRCUIT USING THYRISTOR AS PROTECTION ELEMENT

(75) Inventor: Koichi Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 10/958,319

(22) Filed: Oct. 4, 2004

(65) Prior Publication Data

US 2005/0212009 A1    Sep. 29, 2005

(30) Foreign Application Priority Data

Mar. 25, 2004    (JP)    ............... 2004-089619

(51) Int. Cl.
  *H01L 31/0328*   (2006.01)
  *H01L 31/0336*   (2006.01)
  *H01L 31/072*    (2006.01)
  *H01L 31/109*    (2006.01)
(52) U.S. Cl. ............... 257/173; 257/E29.196
(58) Field of Classification Search ......... 257/107–182, 257/E29.196
See application file for complete search history.

(56) References Cited

U.S. PATENT DOCUMENTS

| | | | |
|---|---|---|---|
| 5,452,171 A | | 9/1995 | Meez et al. |
| 5,528,188 A | * | 6/1996 | Au et al. ............... 327/310 |
| 6,545,321 B2 | | 4/2003 | Morishita |
| 6,768,616 B2 | * | 7/2004 | Mergens et al. ......... 361/56 |
| 6,894,320 B2 | * | 5/2005 | Tsuji et al. ............. 257/173 |
| 7,064,393 B2 | * | 6/2006 | Mergens et al. ......... 257/360 |
| 2002/0053704 A1 | | 5/2002 | Avery et al. |
| 2002/0154463 A1 | * | 10/2002 | Mergens et al. ......... 361/56 |
| 2003/0052368 A1 | * | 3/2003 | Tsuji et al. ............. 257/355 |

FOREIGN PATENT DOCUMENTS

| | | |
|---|---|---|
| JP | 2003-110031 | 11/2003 |
| JP | 2003-318265 | 11/2003 |
| WO | WO 02/075892 A1 | 9/2002 |

OTHER PUBLICATIONS

PCT Published International Application No. US00/21316 filed on Aug. 4, 2000 (WO/01/11685 A1).
Japanese Office Action mailed on Apr. 11, 2006 corresponding to the related Japanese Patent Application No. 2004-089619.
Official Office Action Letter issued Aug. 3, 2007 in counterpart Japanese application (Application No. 2005-10060154.0.), with English language translation.

* cited by examiner

*Primary Examiner*—Howard Weiss
(74) *Attorney, Agent, or Firm*—DLA Piper US LLP

(57) ABSTRACT

A semiconductor device includes a thyristor, trigger circuit and surge detection/leakage reduction circuit. The anode of the thyristor is connected to a first terminal and the cathode thereof is connected to a second terminal. The trigger circuit is configured to fire the thyristor when surge voltage is applied to the first terminal. The surge detection/leakage reduction circuit is provided between the gate of the thyristor and the second terminal and configured to interrupt current flowing from the trigger circuit to the second terminal in the normal operation mode and set trigger voltage which is used to fire the thyristor in cooperation with the trigger circuit at the surge voltage application time.

9 Claims, 11 Drawing Sheets

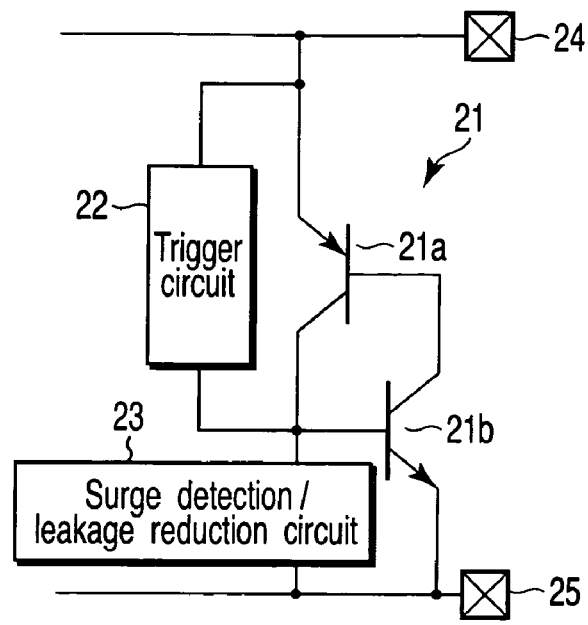
F I G. 1
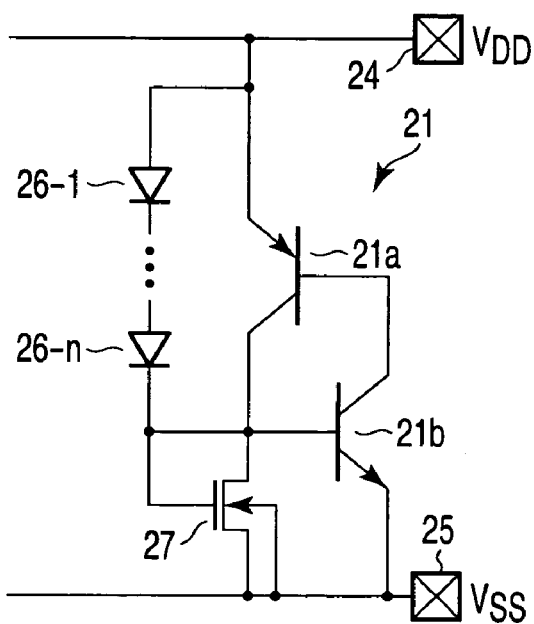
F I G. 2

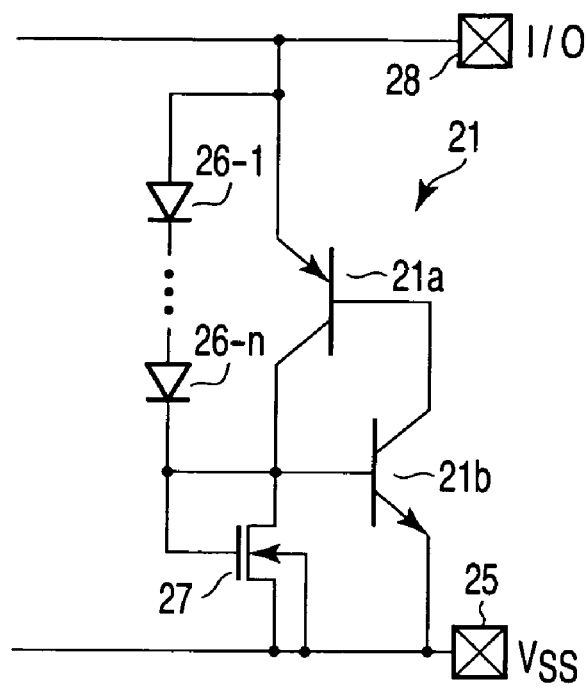
F I G. 5
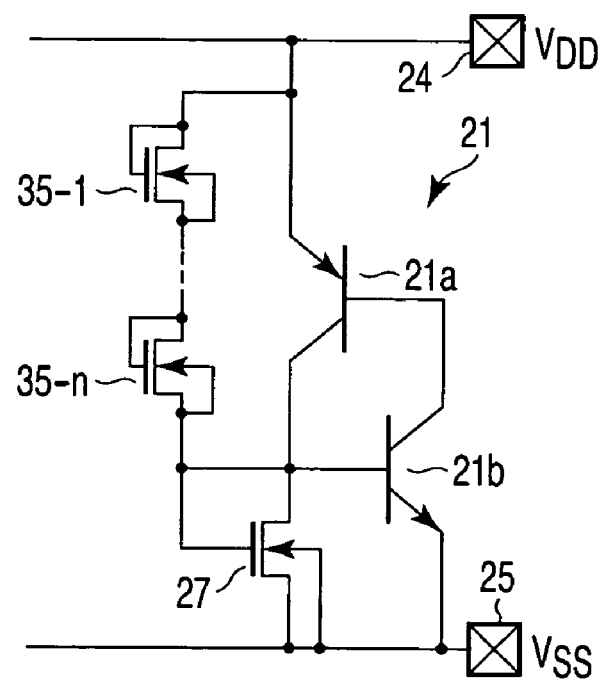
F I G. 6

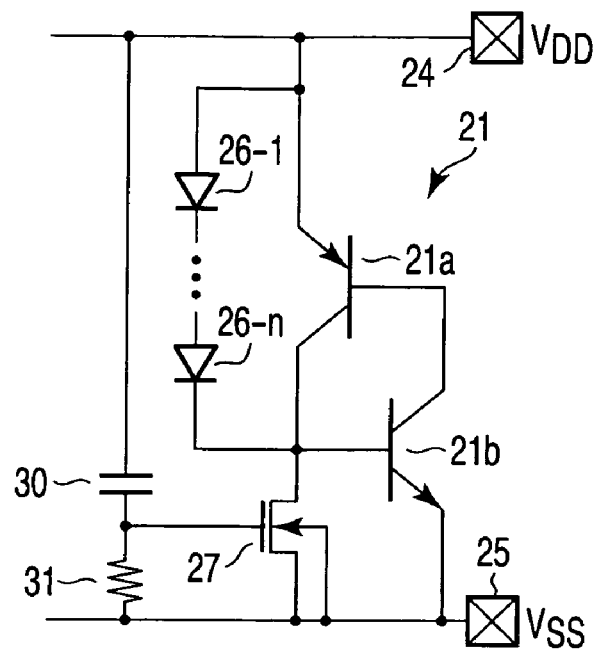
F I G. 9
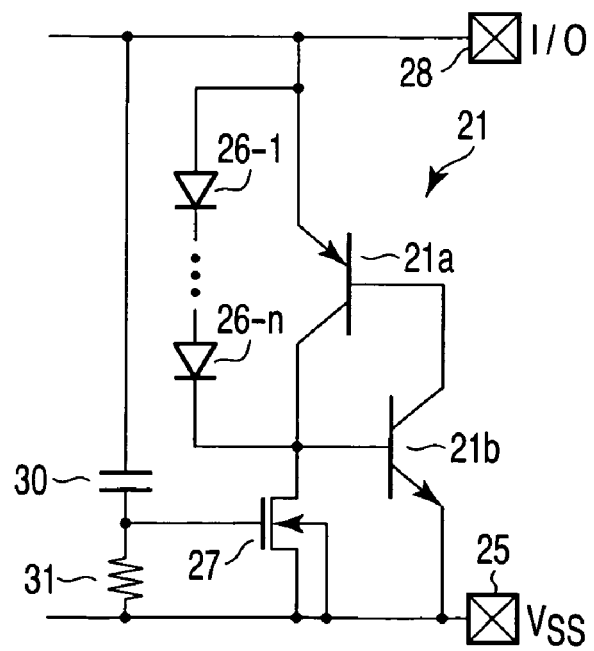
F I G. 10

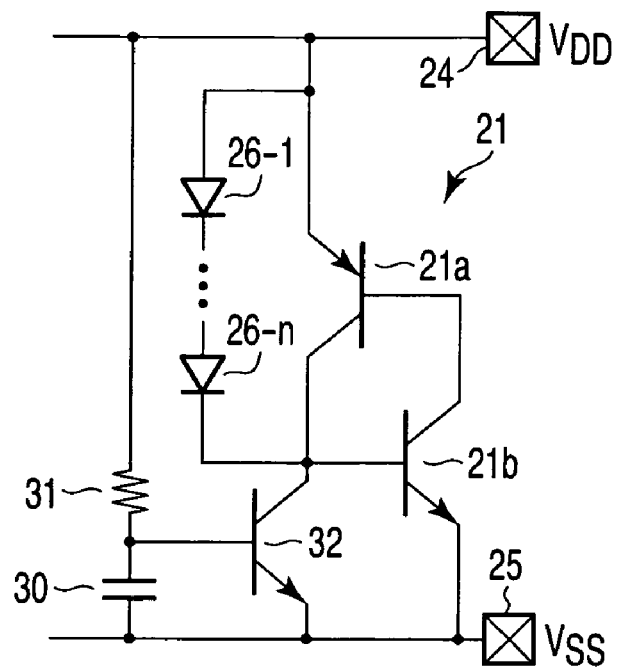
F I G. 15
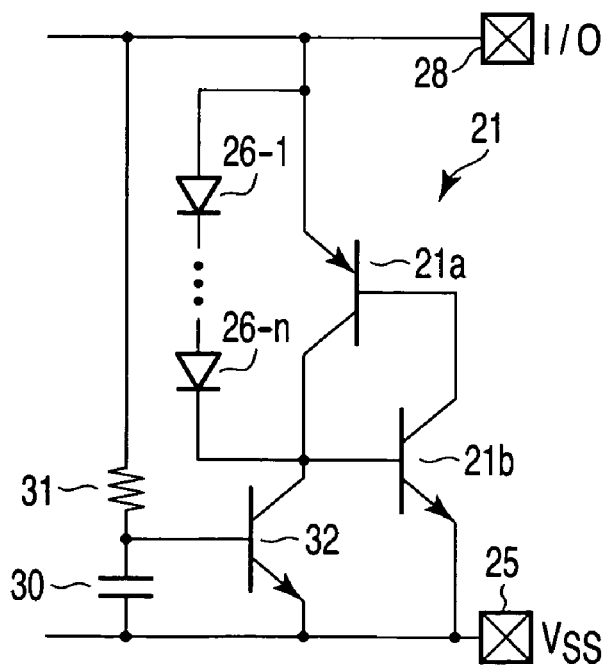
F I G. 16

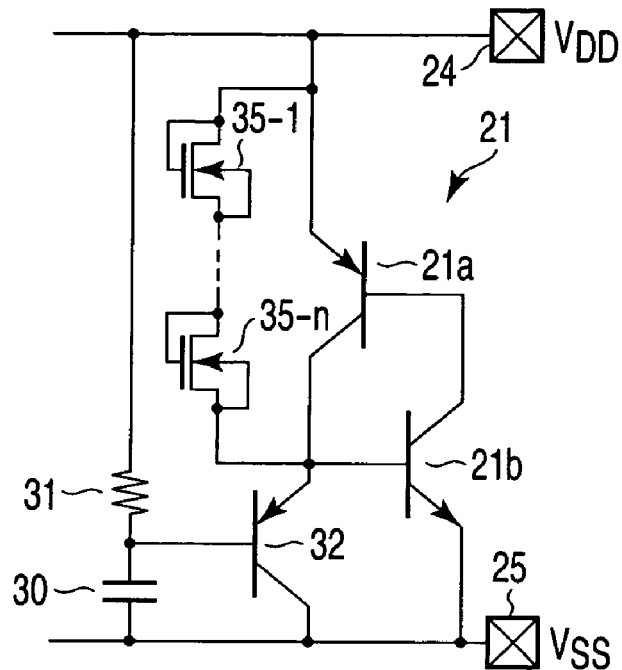
F I G. 17
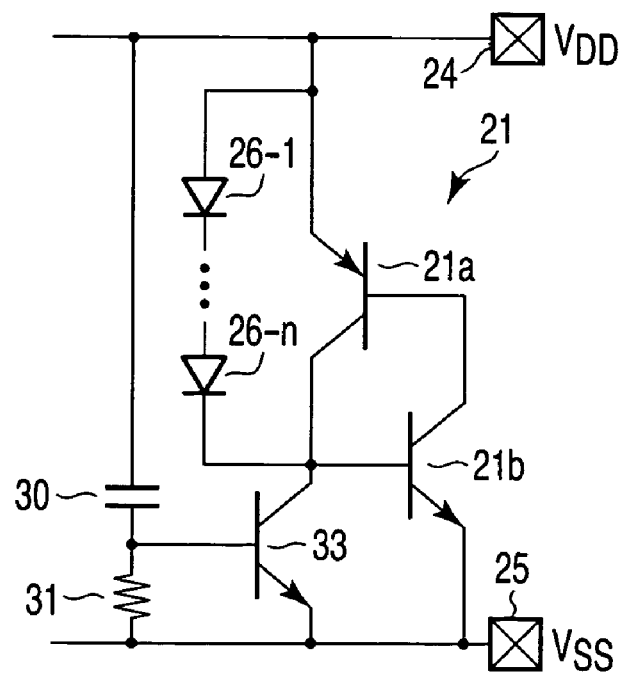
F I G. 18

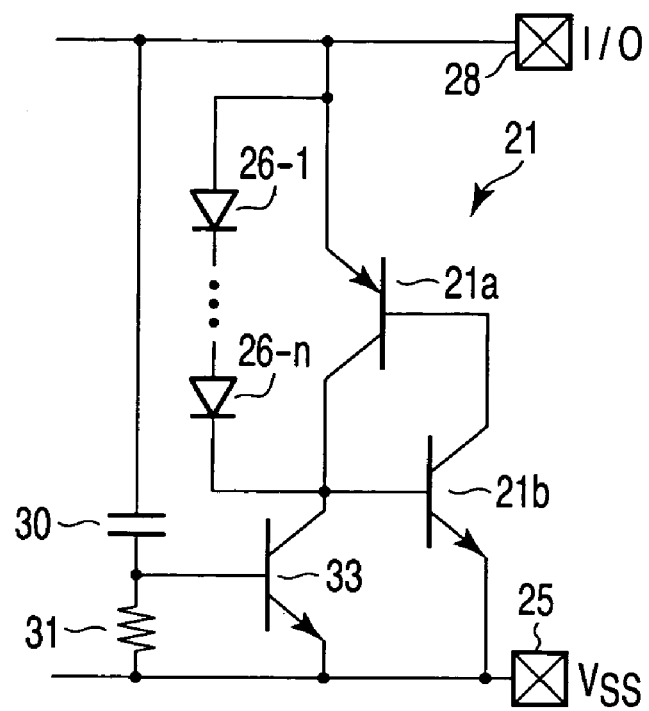
F I G. 19
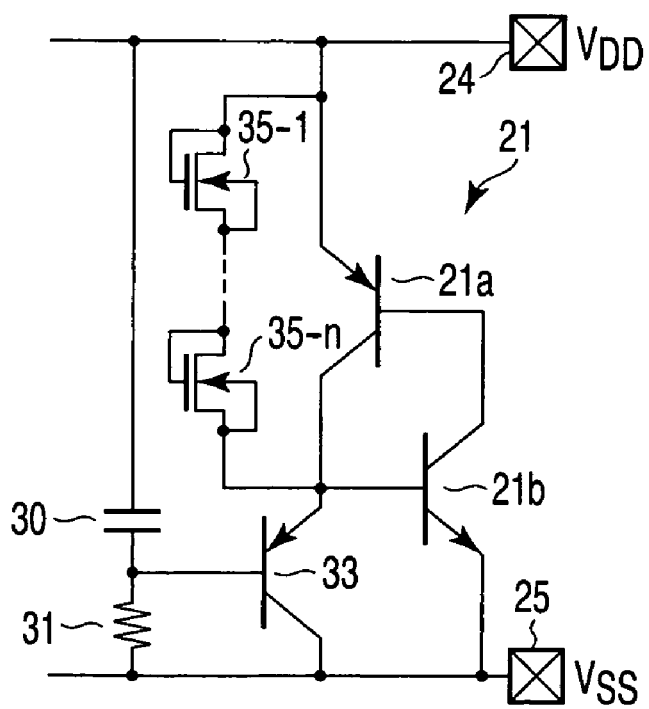
F I G. 20

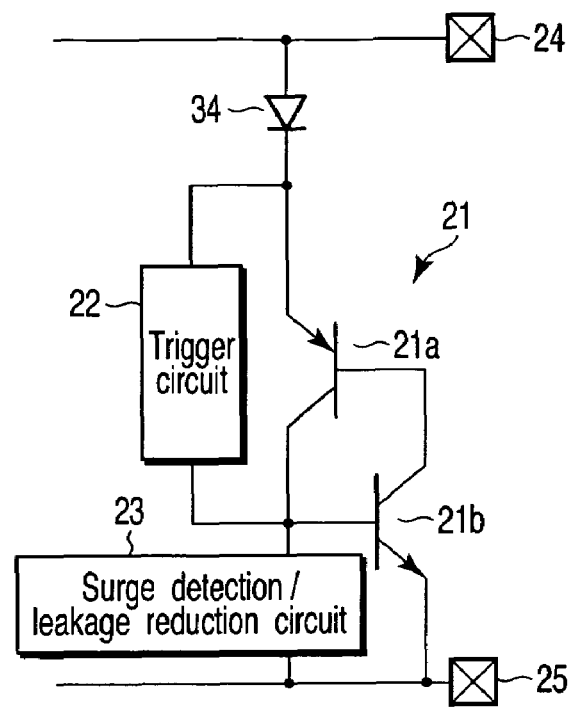
F I G. 21
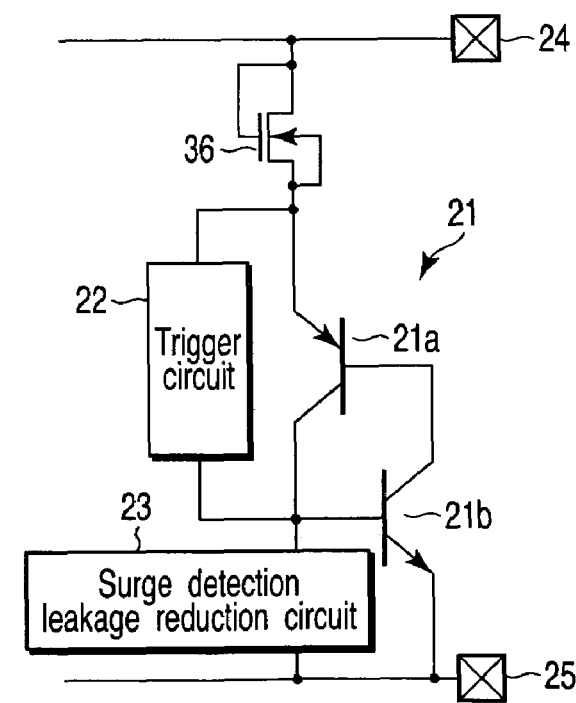
F I G. 22

SEMICONDUCTOR DEVICE HAVING ELECTROSTATIC DESTRUCTION PROTECTION CIRCUIT USING THYRISTOR AS PROTECTION ELEMENT

CROSS-REFERENCE TO RELATED APPLICATIONS

This application is based upon and claims the benefit of priority from prior Japanese Patent Application No. 2004-089619, filed Mar. 25, 2004, the entire contents of which are incorporated herein by reference.

BACKGROUND OF THE INVENTION

1. Field of the Invention

This invention relates to a semiconductor device having an electrostatic destruction protection circuit which prevents flow of excessively large current caused by a surge or the like and more particularly to a semiconductor device having an electrostatic destruction protection circuit which uses a thyristor (SCR) as a protection element.

2. Description of the Related Art

In a semiconductor device such as an IC and LSI, an electrostatic destruction (ESD) protection circuit is provided to protect an internal circuit from excessively large current caused by a surge or the like.

Various configurations of the electrostatic destruction protection circuit are proposed and circuits which protect the internal circuits by use of diodes and MOS transistors are widely used. However, as the integration density of the semiconductor device is more enhanced and the operation voltage is further lowered, it becomes impossible to sufficiently protect the internal circuit only by use of the diodes or MOS transistors. For example, in Jpn. Pat. Appln. KOKAI Publication No. 2003-318265 and International Patent Publication No. WO01/011685, an electrostatic destruction protection circuit which uses a thyristor as a protection element is proposed. The thyristor can perform the high-speed switching operation, permits large current to flow therein and is difficult to be broken. Therefore, the electrostatic destruction protection circuit using the thyristor has an excellent characteristic of high performance and high protection capability.

The electrostatic destruction protection circuit is configured by a thyristor, a plurality of diodes and a resistor. The anode of the thyristor is connected to a terminal (power supply terminal) to which power supply voltage is applied and the cathode thereof is connected to a terminal (ground terminal) to which ground potential is applied. The cathodes of the plurality of diodes are respectively connected to the anodes of the next-stage diodes and the plurality of diodes are connected between the power supply terminal and the gate of the thyristor. The diodes function as a trigger circuit of the thyristor. A resistor which sets the trigger voltage of the thyristor in cooperation with the plurality of diodes is connected between the gate of the thyristor and the ground terminal.

With the above configuration, if voltage between the power supply terminal and the ground terminal varies due to a surge or the like to a greater extent, current flows from the power supply terminal to the ground terminal via a plurality of diodes and resistor. Therefore, voltage occurs at the gate of the thyristor and trigger current is supplied to the gate of the thyristor based on the above voltage (trigger voltage). As a result, the thyristor is fired or triggered and short-circuits a path between the power supply terminal and the ground terminal to leakage the surge and protect the internal circuit. The trigger voltage is determined by the sum of the forward voltages $V_F$ of the plurality of diodes and the resistance of the resistor.

By further enhancing the integration density of the recent semiconductor device and lowering the operation voltage thereof, MOS transistors configuring the internal circuit are further miniaturized and the gate oxide film is made thinner and is liable to be destroyed. In order to safely protect the thus miniaturized MOS transistor, it is necessary to lower the trigger voltage which turns on the thyristor at the time of application of a surge voltage and set the trigger voltage lower than the breakdown voltage of the gate oxide film.

If the gate oxide film of the MOS transistor is thick, voltage applied between the power supply terminal and the ground terminal exceeds the maximum value of the power supply voltage and the thyristor is turned on in a range of voltage lower than the breakdown voltage of the gate oxide film. Therefore, the internal circuit can be effectively protected from the excessively large current caused by a surge. However, if the gate oxide film is thin, the breakdown voltage of the gate oxide film is lowered and a difference between the maximum value of the power supply voltage and the breakdown voltage of the gate oxide film becomes smaller. As a result, there occurs a possibility that voltage which turns on the thyristor may exceed the breakdown voltage of the gate oxide film. That is, the gate oxide film of the MOS transistor configuring the internal circuit will be destroyed before the protection operation by the electrostatic destruction protection circuit is performed.

In order to realize the low trigger voltage in the electrostatic destruction protection circuit using the thyristor as described above, it is necessary to reduce the number of stages of the diodes which function as the trigger circuit. However, if the number of stages of the diodes is reduced, the leakage current flowing from the power supply terminal to the ground terminal through the diodes and resistor in the normal operation mode becomes large and the current consumption increases.

BRIEF SUMMARY OF THE INVENTION

According to an aspect of the invention there is provided a semiconductor device comprising a thyristor having an anode connected to a first terminal and a cathode connected to a second terminal, a trigger circuit configured to fire the thyristor when surge voltage is applied to the first terminal, and a surge detection/leakage reduction circuit provided between a gate of the thyristor and the second terminal and configured to interrupt current flowing from the trigger circuit to the second terminal in a normal operation mode and set trigger voltage which is used to fire the thyristor in cooperation with the trigger circuit at surge voltage application time.

According to another aspect of the invention there is provided a semiconductor device comprising a thyristor having an anode connected to a first terminal and a cathode connected to a second terminal, a trigger circuit configured to fire the thyristor when surge voltage is applied to the first terminal, and a variable resistor circuit provided between a gate of the thyristor and the second terminal and configured to have high resistance at normal operation time and low resistance at surge voltage application time.

According to still another aspect of the invention there is provided a semiconductor device comprising a thyristor having an anode connected to a first terminal and a cathode connected to a second terminal, at least one diode provided between the first terminal and a gate of the thyristor, and a MOS transistor having a current path connected at one end to the gate of the thyristor and connected at the other end to the second terminal and a gate connected to the gate of the thyristor.

BRIEF DESCRIPTION OF THE SEVERAL VIEWS OF THE DRAWING

FIG. 1 is a circuit diagram showing the schematic configuration of an electrostatic destruction protection circuit, for illustrating a semiconductor device according to an embodiment of this invention;

FIG. 2 is a circuit diagram showing a concrete example of the configuration of an electrostatic destruction protection circuit, for illustrating a semiconductor device according to a first embodiment of this invention;

FIG. 5 is a circuit diagram showing another example of the arrangement of the electrostatic destruction protection circuit shown in FIG. 2;

FIG. 6 is a circuit diagram showing another example of the configuration of a trigger circuit in the electrostatic destruction protection circuit shown in FIGS. 2 and 5;

FIG. 9 is a circuit diagram showing a concrete example of the configuration of an electrostatic destruction protection circuit, for illustrating a semiconductor device according to a third embodiment of this invention;

FIG. 10 is a circuit diagram showing another example of the arrangement of the electrostatic destruction protection circuit shown in FIG. 9;

FIG. 15 is a circuit diagram showing a concrete example of the configuration of an electrostatic destruction protection circuit, for illustrating a semiconductor device according to a fifth embodiment of this invention;

FIG. 16 is a circuit diagram showing another example of the arrangement of the electrostatic destruction protection circuit shown in FIG. 15;

FIG. 17 is a circuit diagram showing another example of the configuration of a trigger circuit in the electrostatic destruction protection circuit shown in FIGS. 15 and 16;

FIG. 18 is a circuit diagram showing a concrete example of the configuration of an electrostatic destruction protection circuit, for illustrating a semiconductor device according to a sixth embodiment of this invention;

FIG. 19 is a circuit diagram showing another example of the arrangement of the electrostatic destruction protection circuit shown in FIG. 18;

FIG. 20 is a circuit diagram showing another example of the configuration of a trigger circuit in the electrostatic destruction protection circuit shown in FIGS. 18 and 19;

FIG. 21 is a circuit diagram showing a first modification of the electrostatic destruction protection circuit in the semiconductor device according to the first and third to sixth embodiments; and FIG. 22 is a circuit diagram showing another example of the configuration of the electrostatic destruction protection circuit shown in FIG. 21.

DETAILED DESCRIPTION OF THE INVENTION

Figure 3:
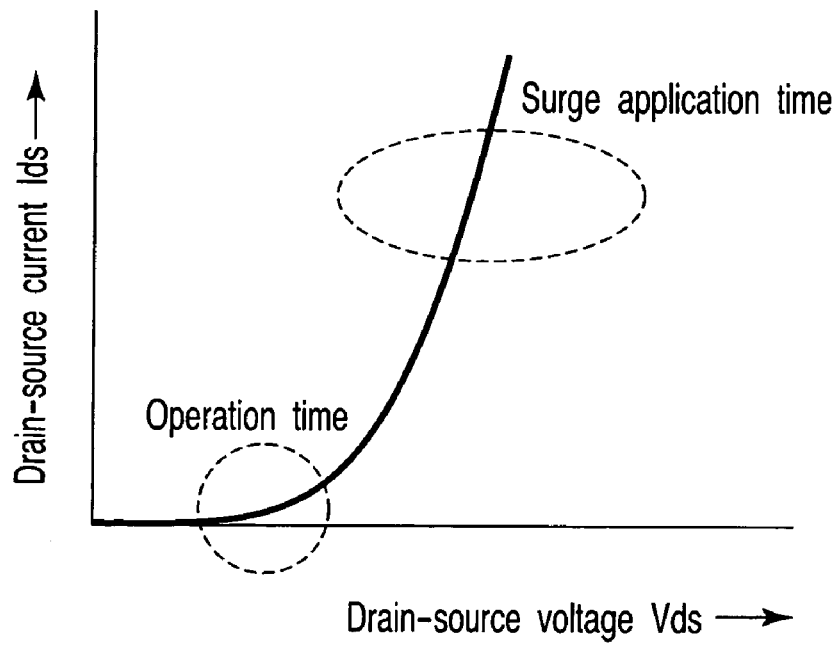
FIG. 3 is a characteristic diagram showing the relation between drain-source current and drain-source voltage of a MOS transistor at the normal operation time and surge voltage application time of the electrostatic destruction protection circuit shown in FIG. 2.

FIG. 1 is a circuit diagram showing the schematic configuration of an electrostatic destruction protection circuit, for illustrating a semiconductor device according to an embodiment of this invention. The circuit includes a thyristor 21, trigger circuit 22, surge detection/leakage reduction circuit 23 and the like. The anode of the thyristor 21 (the emitter of a PNP bipolar transistor 21a configuring the thyristor 21) is connected to a first terminal 24 and the cathode thereof (the emitter of an NPN bipolar transistor 21b configuring the thyristor 21) is connected to a second terminal 25. The trigger circuit 22 is provided between the anode of the thyristor 21 and the gate thereof (a connection node of the collector of the PNP bipolar transistor 21a and the base of the NPN bipolar transistor 21b). The trigger circuit 22 detects surge (ESD surge) voltage applied to the first terminal 24 and supplies trigger current which is used to fire the thyristor 21. Further, the surge detection/leakage reduction circuit 23 is connected between the gate of the thyristor 21 and the second terminal 25. The surge detection/leakage reduction circuit 23 detects surge voltage and sets trigger voltage which triggers the thyristor 21 in cooperation with the trigger circuit 22 when the surge voltage is applied. Further, it cuts off or reduces the leakage current flowing from the trigger circuit 22 to the second terminal 24 at the normal operation time. In other words, the circuit 23 is so configured that the resistance thereof will be set high at the normal operation time and low at the protection operation time.

With the above configuration, even when the trigger circuit 22 is configured by use of the diodes and the number of stages of the diodes is reduced to realize a low trigger voltage, the leakage current flowing from the trigger circuit 22 to the second terminal 25 can be cut off or reduced at the normal operation time by use of the surge detection/leakage reduction circuit 23.

Specifically, for example, in an LSI in which the design rule is 0.13 μm, the power supply voltage is 1.5V and the film thickness of the gate oxide film of the MOS transistor configuring the internal circuit is 3 nm, the number of stages of diodes can be reduced from three-stages of diodes which are required in the trigger circuit to two-stages of diodes.

In the conventional electrostatic destruction protection circuit, assume that the trigger voltage of approximately 3.5V is obtained in the above condition and the resistance of a resistor provided between the gate of the thyristor and the terminal 25 is 1 kΩ. Then, when the trigger circuit is configured by use of two-stage diodes, a leakage current (at the high temperature time) of approximately $10^{-5}$ A will flow. On the other hand, in the circuit of FIG. 1, the circuit formed in the same condition permits only a leakage current (at the high temperature time) of approximately $10^{-7}$ A to flow.

Therefore, it is possible to reduce the leakage current at the normal operation time and suppress the consumption current without losing the feature that the high performance and high protection capability can be provided in the electrostatic destruction protection circuit using the thyristor.

Next, the concrete example of the configuration and the operation to realize the above protection operation are explained more in detail by use of the first to sixth embodiments and first to fourth modifications.

First Embodiment

FIG. 2 is a circuit diagram showing a concrete example of the configuration of an electrostatic destruction protection circuit, for illustrating a semiconductor device according to a first embodiment of this invention. In the circuit of FIG. 2, a trigger circuit 22 is configured by use of n diodes 26-1 to 26-n and a surge detection/leakage reduction circuit 23 is configured by use of an N-channel MOS transistor 27. Further, a case wherein the electrostatic destruction protection circuit is arranged between power supply terminals, power supply voltage $V_{DD}$ is applied to a first power supply terminal 24 and power supply voltage (ground potential) $V_{SS}$ is applied to a second terminal 25 is shown as an example.

That is, the anode of the thyristor 21 is connected to the power supply terminal 24 and the cathode thereof is connected to the power supply terminal 25. The cathodes of the diodes 26-1 to 26-n acting as the trigger circuit are respectively connected to the anodes of the next-stage diodes. The anode of the diode 26-1 is connected to the terminal 24 and the cathode of the diode 26-n is connected to the gate of the thyristor 21. Further, the drain and gate of the MOS transistor 27 are connected to the gate of the thyristor 21 and the source and back-gate thereof are connected to the power supply terminal 25. The MOS transistor 27 functions as a variable resistor (or variable resistor circuit) whose resistance is changed at the normal operation time and ESD application time instead of a resistor (fixed resistor) connected between the gate of the thyristor and the ground terminal in the conventional electrostatic destruction protection circuit.

With the above configuration, as shown in FIG. 3, since the source-drain voltage Vds of the MOS transistor 27 is low at the normal operation time, the MOS transistor 27 is turned off and almost no drain-source current Ids flows. Therefore, the leakage current at the normal operation time can be reduced. In contrast, a trigger current flows from the power supply terminal 24 to the gate of the thyristor 21 via the diodes 26-1 to 26-n at the surge voltage application time. At this time, the gate potential of the MOS transistor 27 rises (the drain-source voltage Vds also rises) to turn on the MOS transistor 27 and a large drain-source current Ids flows. The trigger voltage of the thyristor 21 is set by the sum of the forward voltages $V_F$ of the diodes 26-1 to 26-n and the on resistance of the MOS transistor 27. If the thyristor 21 is fired, a short circuit is formed between the power supply terminals 24 and 25 and the surge voltage applied to the power supply terminal 24 is supplied to the power supply terminal (ground potential node) 25 to protect the internal circuit.

Figure 4:
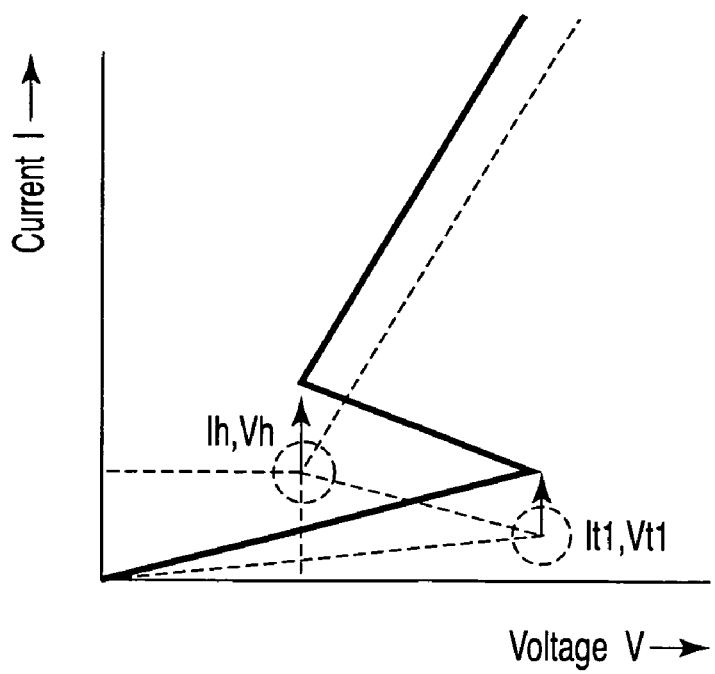
FIG. 4 is a voltage-current characteristic diagram of a thyristor in the electrostatic destruction protection circuit shown in FIG. 2.

FIG. 4 is a voltage-current characteristic diagram of the thyristor in the electrostatic destruction protection circuit shown in FIG. 2. If the MOS transistor 27 is used instead of the resistor in the conventional electrostatic destruction protection circuit, the impedance of a trigger current path at the surge voltage application time is lowered. As a result, a hold current Ih of the thyristor 21 increases. Since the thyristor 21 used as a protection element is inhibited from being operated at the normal operation time, the relation of Ih>ILU (latch-up specifying current) is normally set up.

With the circuit configuration shown in FIG. 2, the current amount of the trigger current can be adjusted by adjusting the on resistance of the MOS transistor 27. As a result, the electrostatic destruction protection circuit can be tuned so as to protect an IC and LSI in which the electrostatic destruction protection circuit is used in an optimum fashion. For example, if the trigger current is increased, both of the hold current Ih and current It1 with which the thyristor 21 is turned on increase as shown by the solid line from the characteristic shown by the broken lines in FIG. 4. Thus, when the power supply voltage or signal instantly varies due to the erroneous operation of the thyristor 21 at the normal operation time, that is, noise or the like, the margin for the erroneous operation such as latch-up can be made large.

Therefore, with the above configuration, even if the number of stages of the diodes 26-1 to 26-n acting as the trigger circuit is reduced to lower the trigger voltage, the MOS transistor 27 is set turned off at the normal operation time to interrupt the path of the leakage current. Further, at this time, the margin for prevention of the erroneous operation in the normal operation mode can be attained by setting up the relation of Ih>ILU (latch-up specifying current). Of course, the MOS transistor 27 is turned on at the surge voltage application time so as to function in the same manner as the resistor (fixed resistor) in the conventional electrostatic destruction protection circuit. Therefore, the protection capability is not reduced.

In the first embodiment, a case wherein the first, second power supply terminals 24, 25 are used as the power supply terminals is explained as an example. However, as shown in FIG. 5, the same protection operation can be attained by providing the protection circuit between an I/O terminal 28 and the power supply terminal 25.

Further, in FIGS. 2 and 5, a case wherein the trigger circuit 22 is configured by the diodes 26-1 to 26-n is explained as an example. However, as shown in FIG. 6, the same operation and effect can be attained by configuring the trigger circuit by use of a plurality of N-channel transistors 35-1 to 35-n (diode chain) each having a drain and gate commonly connected (diode-connected).

Of course, P-channel MOS transistors which are diode-connected can be used instead of the N-channel MOS transistors 35-1 to 35-n.

Further, the trigger circuit 22 can be configured by one diode or one MOS transistor depending on the condition of the power supply voltage of the IC and LSI and the film thickness of the gate oxide film, for example.

Second Embodiment

Figure 7:
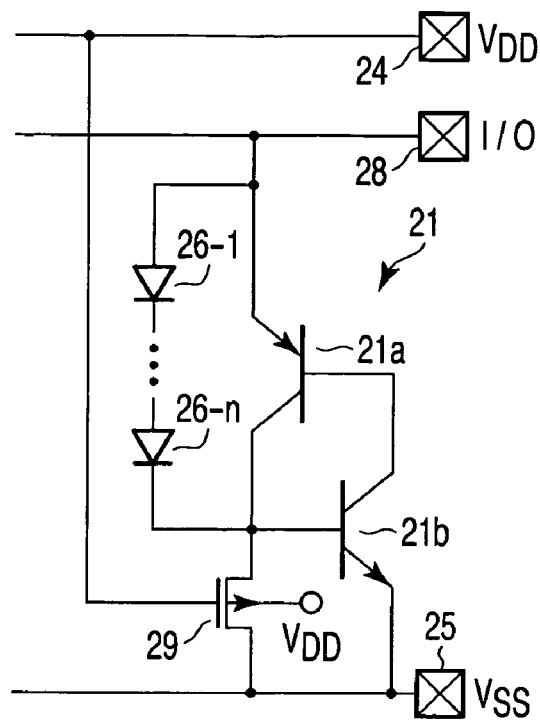
FIG. 7 is a circuit diagram showing a concrete example of the configuration of an electrostatic destruction protection circuit, for illustrating a semiconductor device according to a second embodiment of this invention.

FIG. 7 is a circuit diagram showing a concrete example of the configuration of an electrostatic destruction protection circuit, for illustrating a semiconductor device according to a second embodiment of this invention. In the electrostatic destruction protection circuit shown in FIG. 7, the thyristor in the circuit of FIG. 2 is connected between an I/O terminal 28 and a power supply terminal 25 and the surge detection/leakage reduction circuit 23 is configured by a P-channel MOS transistor 29. That is, the anode of the thyristor 21 is connected to the I/O terminal 28 and the cathode thereof is connected to the power supply terminal 25. The cathodes of diodes 26-1 to 26-n acting as the trigger circuit are respectively connected to the anodes of the next-stage diodes. The anode of the diode 26-1 is connected to the I/O terminal 28 and the cathode of the diode 26-n is connected to the gate of the thyristor 21. Further, the source of the MOS transistor 29 is connected to the gate of the thyristor 21, the drain thereof is connected to the power supply terminal 25 and the gate and back-gate thereof are connected to a power supply terminal 24.

With the above configuration, power supply voltage $V_{DD}$ is applied to the gate of the MOS transistor 29 in the normal operation mode to turn the MOS transistor 29 off. In contrast, if a surge voltage is applied to the I/O terminal 28, trigger current flows from the I/O terminal 28 to the gate of the thyristor 21 via the diodes 26-1 to 26-n. When the gate potential of the thyristor 21 is set higher than the power supply voltage $V_{DD}$ by the threshold voltage of the MOS transistor 29, the MOS transistor 29 is turned on. The trigger voltage of the thyristor 21 is set by the sum of the forward voltages $V_F$ of the diodes 26-1 to 26-n and the on resistance of the MOS transistor 29. If the trigger current is supplied to the thyristor 21 to fire the same, the surge voltage applied to the I/O terminal 28 is supplied to the power supply terminal (ground potential) 25 to protect the internal circuit.

Thus, with the above configuration, even if the number of stages of the diodes 26-1 to 26-n acting as the trigger circuit is reduced to lower the trigger voltage, the MOS transistor 29 is turned off state at the normal operation time to interrupt the path of the leakage current. Of course, the MOS transistor 29 is turned on at the surge voltage application time so as to function in the same manner as the resistor (fixed resistor) in the conventional electrostatic destruction protection circuit. Therefore, the protection capability is not reduced.

Figure 8:
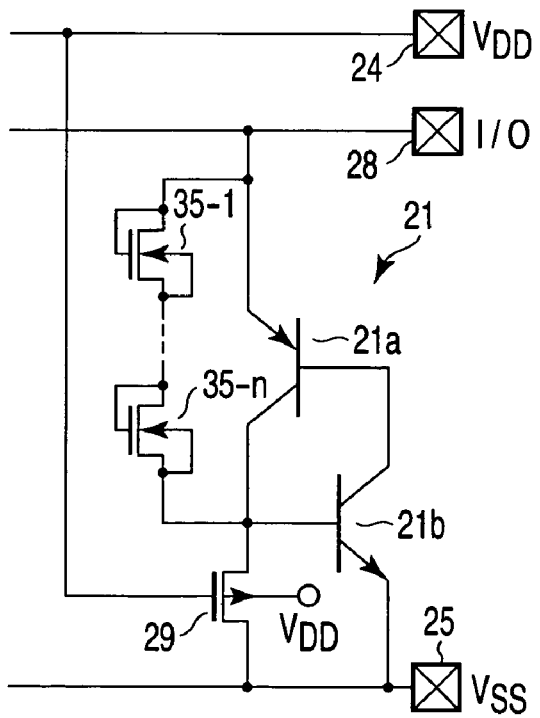
FIG. 8 is a circuit diagram showing another example of the configuration of a trigger circuit in the electrostatic destruction protection circuit shown in FIG. 7.

Further, in FIG. 7, a case wherein the trigger circuit 22 is configured by the diodes 26-1 to 26-n is explained as an example. However, as shown in FIG. 8, the same operation and effect can be attained by configuring the trigger circuit by use of a plurality of N-channel transistors 35-1 to 35-n each having a drain and gate commonly connected (diode-connected).

Of course, P-channel MOS transistors which are diode-connected can be used instead of the N-channel MOS transistors 35-1 to 35-n.

Further, the trigger circuit 22 can be configured by one diode or one MOS transistor depending on the condition of the power supply voltage of the IC and LSI and the film thickness of the gate oxide film, for example.

Third Embodiment

FIG. 9 is a circuit diagram showing a concrete example of the configuration of an electrostatic destruction protection circuit, for illustrating a semiconductor device according to a third embodiment of this invention. In the circuit of FIG. 9, a surge detection/leakage reduction circuit 23 is configured by an N-channel MOS transistor 27, capacitor 30 and resistor 31. That is, the anode of a thyristor 21 is connected to a power supply terminal 24 and the cathode thereof is connected to a power supply terminal 25. The cathodes of diodes 26-1 to 26-n acting as a trigger circuit are respectively connected to the anodes of the next-stage diodes. The anode of the diode 26-1 is connected to the power supply terminal 24 and the cathode of the diode 26-n is connected to the gate of the thyristor 21. Further, the drain of the MOS transistor 27 is connected to the gate of the thyristor 21 and the source and back-gate thereof are connected to the power supply terminal 25. One of the electrodes of the capacitor 30 is connected to the power supply terminal 24 and the other electrode thereof is connected to the gate of the MOS transistor 27. One end of the resistor 31 is connected to the gate of the MOS transistor 27 and the other end thereof is connected to the power supply terminal 25.

With the above configuration, the MOS transistor 27 is turned off in the normal operation mode so as to permit almost no leakage current to flow. In contrast, if a surge voltage is applied, trigger current flows from the power supply terminal 24 to the gate of the thyristor 21 via the diodes 26-1 to 26-n. Then, the gate potential of the MOS transistor 27 is raised by displacement current caused by the capacitor 30 and the MOS transistor 27 is turned on. As a result, the thyristor 21 is fired and the surge voltage applied to the power supply terminal 24 is supplied to the power supply terminal (ground potential) 25 to protect the internal circuit.

Thus, with the above configuration, even if the number of stages of the diodes 26-1 to 26-n acting as the trigger circuit is reduced to lower the trigger voltage, the MOS transistor 27 is set turned off at the normal operation time to interrupt the path of a leakage current. Further, the MOS transistor 27 is turned on at the surge voltage application time so as to function in the same manner as the resistor (fixed resistor) in the conventional electrostatic destruction protection circuit. Therefore, the protection capability is not reduced.

In the third embodiment, a case wherein the electrostatic destruction protection circuit is arranged between the power supply terminals 24 and 25 is explained as an example. However, as shown in FIG. 10, the same protection operation can be performed even when the electrostatic destruction protection circuit is arranged between an I/O terminal 28 and the power supply terminal 25.

In this case, however, a time constant circuit configured by the capacitor 30 and resistor 31 is connected to the I/O terminal 28 and the data input/output operation in the normal operation mode is delayed. The significant effect of interrupting the leakage current can be attained, and therefore, it is preferable to adequately and selectively use the circuit of the third embodiment and the circuit of the first and second embodiments according to the required protection characteristic.

Figure 11:
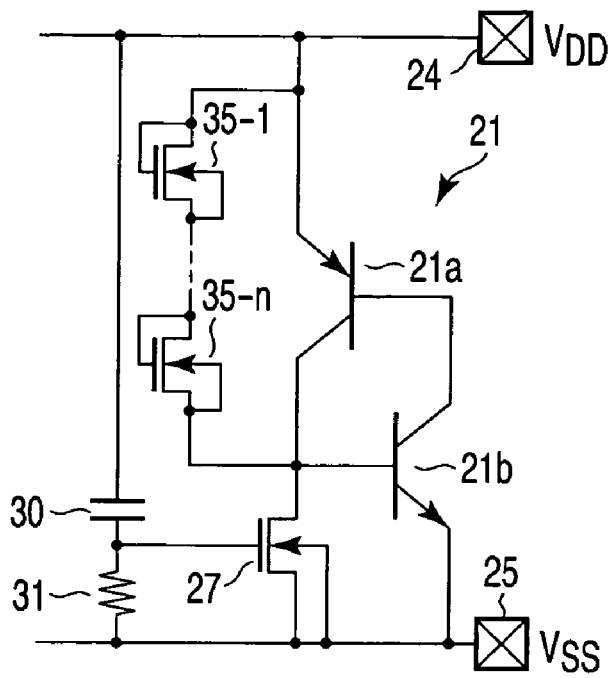
FIG. 11 is a circuit diagram showing another example of the configuration of a trigger circuit in the electrostatic destruction protection circuit shown in FIGS. 9 and 10.

Further, in FIGS. 9 and 10, a case wherein the trigger circuit 22 is configured by the diodes 26-1 to 26-n is explained as an example. However, as shown in FIG. 11, the same operation and effect can be attained by configuring the trigger circuit by use of a plurality of N-channel transistors 35-1 to 35-n each having a drain and gate commonly connected (diode-connected).

Of course, P-channel MOS transistors which are diode-connected can be used instead of the N-channel MOS transistors 35-1 to 35-n.

Further, the trigger circuit 22 can be configured by one diode or one MOS transistor depending on the condition of the power supply voltage of the IC and LSI and the film thickness of the gate oxide film, for example.

Fourth Embodiment

Figure 12:
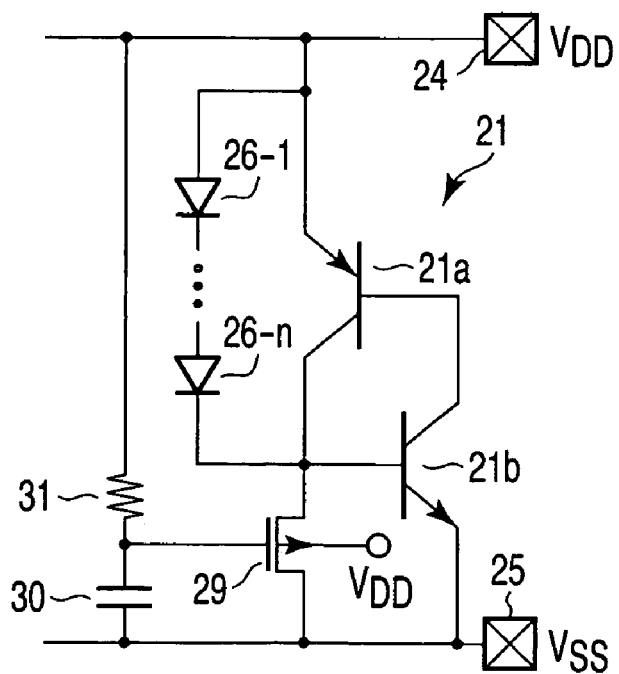
FIG. 12 is a circuit diagram showing a concrete example of the configuration of an electrostatic destruction protection circuit, for illustrating a semiconductor device according to a fourth embodiment of this invention.

FIG. 12 is a circuit diagram showing a concrete example of the configuration of an electrostatic destruction protection circuit, for illustrating a semiconductor device according to a fourth embodiment of this invention. In the circuit shown in FIG. 12, a surge detection/leakage reduction circuit 23 is configured by a P-channel MOS transistor 29, capacitor 30 and resistor 31. That is, the anode of a thyristor 21 is connected to a power supply terminal 24 and the cathode thereof is connected to a power supply terminal 25. The cathodes of diodes 26-1 to 26-n acting as a trigger circuit are respectively connected to the anodes of the next-stage diodes. The anode of the diode 26-1 is connected to the power supply terminal 24 and the cathode of the diode 26-n is connected to the gate of the thyristor 21. Further, the source of the MOS transistor 29 is connected to the gate of the thyristor 21 and the drain thereof is connected to the power supply terminal 25. One end of the resistor 31 is connected to the power supply terminal 24 and the other end thereof is connected to the gate of the MOS transistor 29. One of the electrodes of the capacitor 30 is connected to the gate of the MOS transistor 29 and the other electrode thereof is connected to the power supply terminal 25.

With the above configuration, the MOS transistor 29 is turned off in the normal operation mode so as to permit almost no leakage current to flow. In contrast, if a surge voltage is applied, trigger current flows from the power supply terminal 24 to the gate of the thyristor 21 via the diodes 26-1 to 26-n. Then, the source potential of the MOS transistor 29 is raised and set higher than the gate potential thereof and the MOS transistor 29 is turned on. As a result, the thyristor 21 is fired and the surge voltage applied to the power supply terminal 24 is supplied to the power supply terminal (ground potential) 25 to protect the internal circuit.

Thus, with the above configuration, even if the number of stages of the diodes 26-1 to 26-n acting as the trigger circuit is reduced to lower the trigger voltage, the MOS transistor 29 is turned off at the normal operation time to interrupt the path of leakage current. Further, the MOS transistor 29 is turned on at the surge voltage application time so as to function in the same manner as the resistor in the conventional electrostatic destruction protection circuit. Therefore, the protection capability is not reduced.

Figure 13:
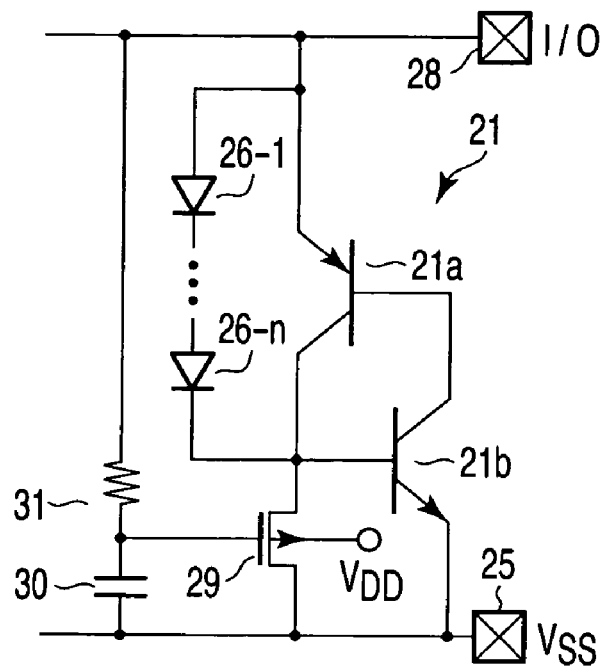
FIG. 13 is a circuit diagram showing another example of the arrangement of the electrostatic destruction protection circuit shown in FIG. 12.

In the fourth embodiment, a case wherein the electrostatic destruction protection circuit is arranged between the power supply terminals 24 and 25 is explained as an example. However, as shown in FIG. 13, the same protection operation can be performed even when the electrostatic destruction protection circuit is arranged between an I/O terminal 28 and the power supply terminal 25. At this time, like the case of the third embodiment, a time constant circuit configured by the capacitor 30 and resistor 31 is connected to the I/O terminal 28 and the data input/output operation in the normal operation mode is delayed. Therefore, it is preferable to adequately and selectively use the circuits according to the required protection characteristic.

Figure 14:
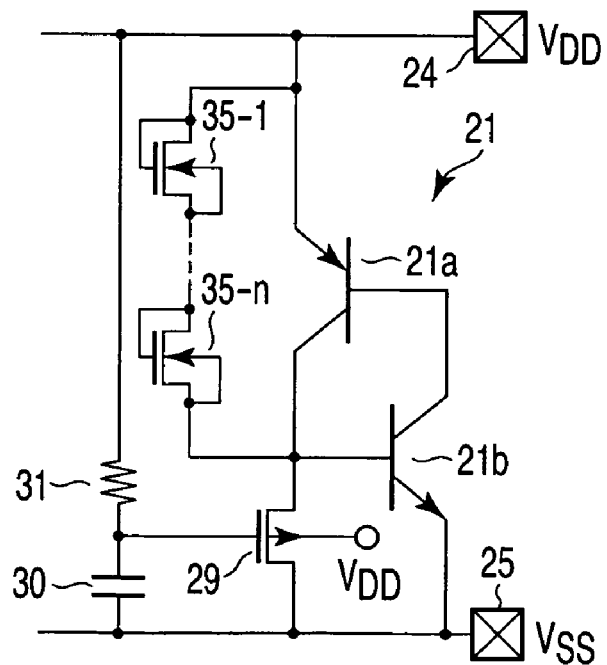
FIG. 14 is a circuit diagram showing another example of the configuration of a trigger circuit in the electrostatic destruction protection circuit shown in FIGS. 12 and 13.

Further, in FIGS. 12 and 13, a case wherein the trigger circuit 22 is configured by the diodes 26-1 to 26-n is explained as an example. However, as shown in FIG. 14, the same operation and effect can be attained by configuring the trigger circuit by use of a plurality of N-channel transistors 35-1 to 35-n each having a drain and gate commonly connected (diode-connected).

Of course, P-channel MOS transistors which are diode-connected can be used instead of the N-channel MOS transistors 35-1 to 35-n.

Further, the trigger circuit 22 can be configured by one diode or one MOS transistor depending on the condition of the power supply voltage of the IC and LSI and the film thickness of the gate oxide film, for example.

Fifth Embodiment

FIG. 15 is a circuit diagram showing a concrete example of the configuration of an electrostatic destruction protection circuit, for illustrating a semiconductor device according to a fifth embodiment of this invention. In the circuit shown in FIG. 15, a surge detection/leakage reduction circuit 23 is configured by a PNP bipolar transistor 32, capacitor 30 and resistor 31. That is, the anode of a thyristor 21 is connected to a power supply terminal 24 and the cathode thereof is connected to a power supply terminal 25. The cathodes of diodes 26-1 to 26-n acting as a trigger circuit are respectively connected to the anodes of the next-stage diodes. The anode of the diode 26-1 is connected to the power supply terminal 24 and the cathode of the diode 26-n is connected to the gate of the thyristor 21. Further, the emitter of the bipolar transistor 32 is connected to the gate of the thyristor 21 and the collector thereof is connected to the power supply terminal 25. One end of the resistor 31 is connected to the power supply terminal 24 and the other end thereof is connected to the base of the bipolar transistor 32. One of the electrodes of the capacitor 30 is connected to the base of the bipolar transistor 32 and the other electrode thereof is connected to the power supply terminal 25.

With the above configuration, the bipolar transistor 32 is turned off in the normal operation mode so as to permit almost no leakage current to flow. In contrast, if a surge voltage is applied, trigger current flows from the power supply terminal 24 to the gate of the thyristor 21 via the diodes 26-1 to 26-n. Then, when the emitter potential of the bipolar transistor 32 is set higher than the base potential thereof by $V_{BE}$ or more, the bipolar transistor 32 is turned on. As a result, the thyristor 21 is fired and the surge voltage applied to the power supply terminal 24 is supplied to the power supply terminal (ground potential) 25 to protect the internal circuit.

Thus, with the above configuration, even if the number of stages of the diodes 26-1 to 26-n acting as the trigger circuit is reduced to lower the trigger voltage, the bipolar transistor 32 is turned off in the normal operation mode to interrupt the path of leakage current. Further, the bipolar transistor 32 is turned on at the surge voltage application time so as to function in the same manner as the resistor in the conventional electrostatic destruction protection circuit. Therefore, the protection capability is not reduced.

In the fifth embodiment, a case wherein the electrostatic destruction protection circuit is arranged between the power supply terminals 24 and 25 is explained as an example. However, as shown in FIG. 16, the same protection operation can be performed even when the electrostatic destruction protection circuit is arranged between an I/O terminal 28 and the power supply terminal 25. At this time, like the case of the third and fourth embodiments, a time constant circuit configured by the capacitor 30 and resistor 31 is connected to the I/O terminal and the data input/output operation in the normal operation mode is delayed. Therefore, it is preferable to adequately and selectively use the circuits according to the required protection characteristic.

Further, in FIGS. 15 and 16, a case wherein the trigger circuit 22 is configured by the diodes 26-1 to 26-n is explained as an example. However, as shown in FIG. 17, the same operation and effect can be attained by configuring the trigger circuit by use of a plurality of N-channel transistors 35-1 to 35-n each having a drain and gate commonly connected (diode-connected).

Of course, P-channel MOS transistors which are diode-connected can be used instead of the N-channel MOS transistors 35-1 to 35-n.

Further, the trigger circuit 22 can be configured by one diode or one MOS transistor depending on the condition of the power supply voltage of the IC and LSI and the film thickness of the gate oxide film, for example.

Sixth Embodiment

FIG. 18 is a circuit diagram showing a concrete example of the configuration of an electrostatic destruction protection circuit, for illustrating a semiconductor device according to a sixth embodiment of this invention. In the circuit shown in FIG. 18, a surge detection/leakage reduction circuit 23 is configured by an NPN bipolar transistor 33, capacitor 30 and resistor 31. That is, the anode of a thyristor 21 is connected to a power supply terminal 24 and the cathode thereof is connected to a power supply terminal 25. The cathodes of diodes 26-1 to 26-n acting as a trigger circuit are respectively connected to the anodes of the next-stage diodes. The anode of the diode 26-1 is connected to the power supply terminal 24 and the cathode of the diode 26-n is connected to the gate of the thyristor 21. Further, the collector of the bipolar transistor 33 is connected to the gate of the thyristor 21 and the emitter thereof is connected to the power supply terminal 25. One of the electrodes of the capacitor 30 is connected to the power supply terminal 24 and the other electrode thereof is connected to the base of the bipolar transistor 33. One end of the resistor 31 is connected to the base of the bipolar transistor 33 and the other end thereof is connected to the power supply terminal 25.

With the above configuration, the bipolar transistor 33 is turned off in the normal operation mode so as to permit almost no leakage current to flow. In contrast, if a surge voltage is applied, a trigger current flows from the power supply terminal 24 to the gate of the thyristor 21 via the diodes 26-1 to 26-n. Then, a base current is supplied to the bipolar transistor 33 by displacement current caused by the capacitor 30 so as to turn the bipolar transistor 33 on. As a result, the thyristor 21 is fired and the surge voltage applied to the power supply terminal 24 is supplied to the power supply terminal (ground potential) 25 to protect the internal circuit.

Thus, with the above configuration, even if the number of stages of the diodes 26-1 to 26-n acting as the trigger circuit is reduced to lower the trigger voltage, the bipolar transistor 33 is turned off in the normal operation mode to interrupt the path of the leakage current. Further, the bipolar transistor 33 is turned on at the surge voltage application time so as to function in the same manner as the resistor in the conventional electrostatic destruction protection circuit. Therefore, the protection capability is not reduced.

In the sixth embodiment, a case wherein the electrostatic destruction protection circuit is arranged between the power supply terminals 24 and 25 is explained as an example. However, as shown in FIG. 19, the same protection operation can be performed even when the electrostatic destruction protection circuit is arranged between an I/O terminal 28 and the power supply terminal 25. At this time, like the case of the third to fifth embodiments, a time constant circuit configured by the capacitor 30 and resistor 31 is connected to the I/O terminal 28 and the data input/output operation in the normal operation mode is delayed. Therefore, it is preferable to adequately and selectively use the circuits according to the required protection characteristic.

Further, in FIGS. 18 and 19, a case wherein the trigger circuit 22 is configured by the diodes 26-1 to 26-n is explained as an example. However, as shown in FIG. 20, the same operation and effect can be attained by configuring the trigger circuit by use of a plurality of N-channel transistors 35-1 to 35-n each having a drain and gate commonly connected (diode-connected).

Of course, P-channel MOS transistors which are diode-connected can be used instead of the N-channel MOS transistors 35-1 to 35-n.

Further, the trigger circuit 22 can be configured by one diode or one MOS transistor depending on the condition of the power supply voltage of the IC and LSI and the film thickness of the gate oxide film, for example.

First Modification

In the first and third to sixth embodiments, a case wherein the anode of the thyristor 21 is connected to the power supply terminal 24 is explained as an example. However, as shown in FIG. 21, a diode 34 can be connected between the anode of the thyristor 21 and the power supply terminal 24. By using the diode 34, the snap-back characteristic of the thyristor 21 can be shifted (adjusted) according to a power supply system used.

For example, as in the second embodiment or the modification of the first and third to sixth embodiments, a diode 34 can be connected between the anode of the thyristor 21 and the I/O terminal 28 in the case of a configuration in which the anode of the thyristor 21 is connected to the I/O terminal 28.

Further, as shown in FIG. 21, one diode 31 is used, but a plurality of stages of diodes can be provided according to the shift amount of the snap-back characteristic.

As shown in FIG. 22, the same effect and operation can be attained by providing an N-channel MOS transistor 36 whose drain and gate are commonly connected (diode-connected). Of course, a diode-connected P-channel MOS transistor can be used instead of the N-channel MOS transistor 36.

Further, a plurality of transistors having the same configuration as the above N-channel MOS transistor or P-channel MOS transistor may be provided according to the shift amount of the snap-back characteristic.

Second Modification

In the first to sixth embodiments, the anode of the diode 26-1 in the trigger circuit is connected to the power supply terminal 24 (the anode of the thyristor 21). However, it can be connected to another terminal or circuit if trigger current can be caused and supplied to the gate of the thyristor 21 when a surge voltage is applied.

Third Modification

In the first to sixth embodiments, a case wherein the trigger circuit is configured by the diodes 26-1 to 26-n or diode-connected MOS transistors 35-1 to 35-n is explained. However, another trigger circuit with a different configuration can be used if it is a circuit which generates a trigger voltage only when a surge voltage is applied or a circuit which can supply a sufficiently large current required to turn on the thyristor 21 when a surge voltage is applied.

Fourth Modification

In the third to sixth embodiments, a case wherein a circuit portion which detects a surge in the surge detection/leakage reduction circuit 23 is configured by the capacitor 30 and resistor 31 is explained. However, a circuit with another configuration can be used if a switch element (MOS transistors 27, 29 or bipolar transistors 32, 33) can be turned on when a surge is input and turned off at the normal operation time. As the surge detection/leakage reduction circuit 23, a variable resistor or a variable resistor circuit whose resistance is set sufficiently high at the normal operation time and set low when a surge voltage is applied can be used.

As described above, according to one aspect of this invention, a semiconductor device having the electrostatic destruction protection circuit capable of reducing the leakage current at the normal operation time can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a thyristor having an anode connected to a first terminal and a cathode connected to a second terminal, the thyristor including a first bipolar transistor of a first polarity having an emitter connected to the first terminal, and a second bipolar transistor of a second polarity having a collector connected to a base of the first bipolar transistor, a base connected to the collector of the first bipolar transistor, and an emitter connected to the second terminal,
a trigger circuit configured to fire the thyristor when surge voltage is applied to the first terminal, the trigger circuit including a plurality of diodes in which cathodes and anodes are sequentially connected in series between the first terminal and the base of the second bipolar transistor, and
a surge detection/leakage reduction circuit provided between the base of the second bipolar transistor which acts as a gate of the thyristor and the second terminal, and configured to interrupt current flowing from the trigger circuit to the second terminal in normal operation mode and set trigger voltage which is used to fire the thyristor in cooperation with the trigger circuit at surge voltage application time, wherein the surge detection/leakage reduction circuit includes a MOS transistor of a first conductivity type having a current path connected at one end to a node, which is directly connected to both to one end of the plurality of diodes sequentially connected in series and the base of the second bipolar transistor, and connected at the other end to the second terminal, as well as a gate connected to the base of the second bipolar transistor.

2. The semiconductor device according to claim 1, wherein the first terminal is a first power supply terminal to which a power supply voltage is applied, the second terminal is a second power supply terminal to which a ground potential is applied, and the MOS transistor of the fist conductivity type is an N-channel MOS transistor.

3. The semiconductor device according to claim 1, wherein the first terminal is an I/O terminal, the second terminal is a power supply terminal to which a ground potential is applied, and the MOS transistor of the first conductivity type is an N-channel MOS transistor.

4. A semiconductor device comprising:
a thyristor having an anode connected to a first terminal and a cathode connected to a second terminal, the thyristor including a first bipolar transistor of a first polarity having an emitter connected to the first terminal, and a second bipolar transistor of a second polarity having a collector connected to a base of the first bipolar transistor, a base connected to the collector of the first bipolar transistor, and an emitter connected to the second terminal,
a trigger circuit configured to fire the thyristor when surge voltage is applied to the first terminal, the trigger circuit including a plurality of diodes in which cathodes and anodes are sequentially connected in series between the first terminal and the base of the second bipolar transistor, and
a surge detection/leakage reduction circuit provided between the base of the second bipolar transistor which acts as a gate of the thyristor and the second terminal, and configured to interrupt current flowing from the trigger circuit to the second terminal in normal operation mode and set trigger voltage which is used to fire the thyristor in cooperation with the trigger circuit at surge voltage application time, wherein the surge detection/leakage reduction circuit includes a MOS transistor of a second conductivity type having a current path connected at one end to a node, which is directly connected to both one end of the plurality of diodes sequentially connected in series and the base of the second bipolar transistor, and connected at the other end to the second terminal and a gate connected to a third terminal.

5. The semiconductor device according to claim 4, wherein the first terminal is an I/O terminal, the third terminal is a first power supply terminal to which a power supply voltage is applied, the second terminal is a second power supply terminal to which a ground potential is applied, and the MOS transistor of the second conductivity type is a P-channel MOS transistor.

6. A semiconductor device comprising:
a thyristor having an anode connected to a first terminal and a cathode connected to a second terminal, the thyristor including a first bipolar transistor of a first polarity having an emitter connected to the first terminal, and a second bipolar transistor of a second polarity having a collector connected to a base of the first bipolar transistor, a base connected to the collector of the first bipolar transistor, and an emitter connected to the second terminal,
a trigger circuit configured to fire the thyristor when surge voltage is applied to the first terminal, the trigger circuit being connected between the first terminal and the base of the second bipolar transistor, the trigger circuit including a plurality of diodes in which cathodes and anodes are sequentially connected in series between the first terminal and the base of the second bipolar transistor, and
a surge detection/leakage reduction circuit provided between the base of the second bipolar transistor which acts as a gate of the thyristor and the second terminal and configured to interrupt current flowing from the trigger circuit to the second terminal in normal operation mode and set trigger voltage which is used to fire the thyristor in cooperation with the trigger circuit at surge voltage application time, wherein the surge detection/leakage reduction circuit includes a third bipolar transistor of a first polarity having an emitter connected to a node, which is directly connected to both one end of the plurality of diodes sequentially connected in series and the base of the second bipolar transistor, and a collector connected to the second terminal, a resistor connected between a base of the third bipolar transistor and the first terminal, and a capacitor connected between the base of the third bipolar transistor and the second terminal.

7. A semiconductor device comprising:
a thyristor having an anode connected to a first terminal and a cathode connected to a second terminal, the thyristor including a first bipolar transistor of a first polarity having an emitter connected to the first terminal, and a second bipolar transistor of a second polarity having a collector connected to a base of the first bipolar transistor a base connected to the collector of the first bipolar transistor, and an emitter connected to the second terminal, a trigger circuit configured to fire the thyristor when surge voltage is applied to the first terminal, the trigger circuit including a plurality of diodes in which cathodes and anodes are sequentially connected in series between the first terminal and the base of the second bipolar transistor, and a surge detection/leakage reduction circuit provided between the base of the second bipolar transistor which acts as a gate of the thyristor and the second terminal and configured to interrupt current flowing from the trigger circuit to the second terminal in normal operation mode and set trigger voltage which is used to fire the thyristor in cooperation with the trigger circuit at surge voltage application time, wherein the surge detection/leakage reduction circuit includes a third bipolar transistor of a second polarity having a collector connected to a node, which is directly connected to both one end of the plurality of diodes sequentially connected in series and the base of the second bipolar transistor, and an emitter connected to the second terminal, a capacitor connected between a base of the third bipolar transistor and the first terminal, and a resistor connected between the base of the third bipolar transistor and the second terminal.

8. A semiconductor device comprising:

a thyristor having an anode connected to a first terminal and a cathode connected to a second terminal, the thyristor including a first bipolar transistor of a first polarity having an emitter connected to the first terminal, and a second bipolar transistor of a second polarity having a collector connected to a base of the first bipolar transistor, a base connected to the collector of the first bipolar transistor, and an emitter connected to the second terminal, a trigger circuit configured to fire the thyristor when surge voltage is applied to the first terminal, the trigger circuit being connected between the first terminal and the base of the second bipolar transistor, the trigger circuit including a plurality of diodes in which cathodes and anodes are sequentially connected in series between the first terminal and the base of the second bipolar transistor, and a surge detection/leakage reduction circuit provided between the base of the second bipolar transistor which acts as a gate of the thyristor and the second terminal and configured to interrupt current flowing from the trigger circuit to the second terminal in normal operation mode and set trigger voltage which is used to fire the thyristor in cooperation with the trigger circuit at surge voltage application time, wherein the surge detection/leakage reduction circuit includes a switch element connected between a node, which is directly connected to both one end of the trigger circuit and the base of the second bipolar transistor, and the second terminals and a time constant circuit which turns on or off the switch element based on voltage between the first and second terminals.

9. The semiconductor device according to claim 8, wherein the switch element is a transistor, the time constant circuit has a capacitor and resistor serially connected between the first and second terminals, and the transistor is turned on or off according to potential of a connection node of the capacitor and resistor.

* * * * *